(12) United States Patent
Finn et al.

(10) Patent No.: US 7,105,915 B1
(45) Date of Patent: Sep. 12, 2006

(54) CHIP CARRIER A CHIP MODULE AND METHOD OF MANUFACTURING THE CHIP MODULE

(76) Inventors: David Finn, Edelsbergstr. 2 D-87629, Füssen-Weissensee (DE); Manfred Rietzler, Am Alsterberg 10, D-87616, Marktoberdorf (DE)

(*) Notice: Subject to any disclaimer, the term of this patent is extended or adjusted under 35 U.S.C. 154(b) by 0 days.

(21) Appl. No.: 10/019,696

(22) PCT Filed: May 4, 2000

(86) PCT No.: PCT/DE00/01396

§ 371 (c)(1),
(2), (4) Date: Jun. 20, 2002

(87) PCT Pub. No.: WO00/68994

PCT Pub. Date: Nov. 16, 2000

(30) Foreign Application Priority Data

May 5, 1999 (DE) ................. 199 20 593

(51) Int. Cl.
*H01L 23/495* (2006.01)
(52) U.S. Cl. ............. 257/666; 257/668; 438/107; 438/123
(58) Field of Classification Search ............. 257/666, 257/668, 669, 670, 678, 679, 701, 702, 724, 257/737, 786; 438/107, 123, 125, 612, 666
See application file for complete search history.

(56) References Cited

U.S. PATENT DOCUMENTS

| | | | | |
|---|---|---|---|---|
| 3,691,628 A | * | 9/1972 | Kim et al. .................. 257/687 |
| 3,855,693 A | * | 12/1974 | Umbaugh .................... 29/843 |
| 4,125,810 A | * | 11/1978 | Pavio ........................ 455/327 |
| 4,151,579 A | * | 4/1979 | Stark ....................... 361/308.1 |
| 5,122,929 A | * | 6/1992 | Palanisamy et al. ........ 361/760 |
| 5,176,853 A | * | 1/1993 | Sarma et al. ............... 252/512 |
| 5,426,399 A | | 6/1995 | Matsubayashi et al. |
| 5,635,751 A | * | 6/1997 | Ikeda et al. ................ 257/584 |
| 5,677,247 A | * | 10/1997 | Hundt et al. ............... 438/107 |
| 5,681,662 A | | 10/1997 | Chen et al. |
| 5,744,859 A | | 4/1998 | Ouchida |
| 5,847,929 A | | 12/1998 | Bernier et al. |
| 5,888,429 A | * | 3/1999 | Lovell ...................... 252/502 |
| 5,977,783 A | * | 11/1999 | Takayama et al. .......... 324/754 |
| 6,313,651 B1 | * | 11/2001 | Hembree et al. ........... 324/755 |
| 6,326,233 B1 | * | 12/2001 | Hashimoto ................. 438/106 |
| 6,475,896 B1 | * | 11/2002 | Hashimoto ................. 438/613 |
| 6,555,200 B1 | * | 4/2003 | Hashimoto ................. 428/136 |
| 6,815,251 B1 | * | 11/2004 | Akram et al. .............. 438/107 |

FOREIGN PATENT DOCUMENTS

| | | |
|---|---|---|
| DE | 196 01 203 A1 | 3/1997 |
| DE | 195 41 039 A1 | 5/1997 |
| DE | 196 39 646 A1 | 3/1998 |
| EP | 0 391 790 A1 | 4/1990 |
| EP | 0 391790 A1 | 10/1990 |
| EP | 0 421 343 A2 | 4/1991 |
| EP | 0 682 321 A2 | 11/1995 |
| FR | 2 756 955 A1 | 12/1996 |
| FR | 2 756 955 A1 | 6/1998 |

* cited by examiner

*Primary Examiner*—Douglas W Owens
(74) *Attorney, Agent, or Firm*—McGlew & Tuttle, PC

(57) ABSTRACT

A chip carrier for manufacturing a chip module (18), with a substrate and connection leads arranged on the substrate has connection leads designed like stripes and extending parallel over the substrate. The connection leads are electrically conductive connection strands (12, 13) placed on the substrate. The substrate is formed by a carrier film (11).

9 Claims, 2 Drawing Sheets

CHIP CARRIER A CHIP MODULE AND METHOD OF MANUFACTURING THE CHIP MODULE

FIELD OF THE INVENTION

The present invention relates to a chip carrier with a substrate and connection leads arranged on the substrate, wherein the connection leads are designed like stripes and extend parallel over the substrate. In addition, the invention relates to a chip module manufactured using the chip carrier, and a method of manufacturing such a chip module.

BACKGROUND OF THE INVENTION

Chip modules are usually manufactured using chip carriers whose surface is provided with a printed circuit structure for connection with elevated contact metallizations of the chip. The use of printed circuit structures manufactured in etching processes does enable any printed circuit structures desired, in particular those with a complex design. However, just the provision or manufacture of the conventional chip carriers independently of the actual contacting process with the chip for manufacturing the chip module already requires a complex and correspondingly expensive procedure. The use of etching techniques requires an appropriate structure for the carrier layer of the substrate, which in addition to a so-called etch-stop layer must also be provided with a lacquer coating when using lithographic processes for defining the printed circuit structure.

Known from DE 195 41 039 A1 is a chip module with a chip carrier, in which the connection leads formed on an insulation layer extend in a stripe-like design and mutually parallel over the insulation layer of the substrate, and are each allocated to an elevated contact metallization of a chip. To manufacture the known chip module, the individual substrates of the chip carriers are arranged on a continuous substrate carrier, which is connected with the individual substrates via the connection leads extending continuously over the substrate carrier. In the known method, the film-like substrate carrier is used only to connect the connection leads with the substrate.

Known from DE 196 01 203 A1 are a data carrier card and a method of its manufacture, in which the data carrier card consists of a flat, injection molded plastic card body with at least one recess, on which three dimensionally guided printed conductors are applied. A chip can be electrically connected with the printed conductors in the recess, and then have a protective layer cast around it to form the data carrier card.

EP 0 421 343 A2 describes a chip carrier for the connection and electromagnetic shielding of a single chip. The chip carrier has a complex, curved structure with discontinuous connection leads formed on the surface of the chip carrier.

EP 0 682 321 A2 shows a chip carrier to be arranged in a card body. The chip carrier exhibits a carrier substrate with connection leads discontinuously formed on the surface.

EP 0 391 790 A1 describes a chip module or a method of manufacturing an encapsulated chip module with a chip, in which a structured metal film is applied to a carrier film to form connection leads.

FR 2 756 955 A1 describes a method of contacting a chip with a coil on a card-shaped carrier material, which is provided with a printed board arrangement in the form of a coil.

SUMMARY AND OBJECTS OF THE INVENTION

Proceeding from known prior art, the object of the invention is to provide a chip carrier for a chip module or a method of manufacturing a chip module, which exhibits a particularly simple design relative to the known chip modules, and hence opens the door to particularly cost-effective manufacture.

This object is achieved using a chip carrier for forming a chip module with a substrate and connection leads arranged on the substrate. The connection leads are designed like stripes and extend parallel over the substrate. In the chip carrier according to the invention, the connection leads consist of electrically conductive connection strands placed on the substrate, and the substrate is formed by a carrier film.

Designing the connection leads as connection strands that are completely independent of the carrier film makes it possible not to have to manufacture the connection leads based on an expensive etching technique. Therefore, the chip carrier according to the invention consists of a combination of a carrier film and connection strands, which each represent independent elements in the initial state, so that no special technologies, e.g., the use of an etching process, are required for manufacturing the chip carrier, but rather a simple connecting or joining process, wherein the substrate is directly formed by the carrier film. Having the substrate serve as the carrier film also enables substrates with a particularly flat design.

In a particularly preferred embodiment of the chip carrier, the side of the carrier film opposite the connection strands is provided with at least one additional conductive strand, in which the insulating carrier film is arranged between the connection strands on the one hand and the additional conductive strand on the other, forming an intermediate layer.

Adding this at least one conductive strand on the opposite side of the carrier film yields a capacitor structure that is arranged in a parallel circuit with the chip after the connection strands have been contacted with a chip. Precisely in the area of transponder technology, this special configuration of the chip module gives rise to the special advantage when contacting the connection strands with a coil unit that the range of the transponder unit formed by combining the chip and coil unit can be distinctly increased.

In particular with respect to the automated manufacture of chip modules using the chip carriers, it proves advantageous to provide the connection strands at least sectionally with a connecting material coating for contacting with the contact metallizations of the chip, so that the chip can be contacted directly on the connecting strands after providing the substrate without any additional intermediate step. This connecting material coating can consist of a connecting solder coating, or a coating of electrically conductive adhesive or the like.

Providing the connection strands at least sectionally with a contact metallization for contacting with the elevated contact metallizations of the chip makes it possible to obtain especially high-quality, i.e., reliable, connections, in particular due to the surface quality of the connection strands as unproved by the contact metallization. Otherwise, of course, connecting strands made out of copper or a copper alloy can be used to produce a direct connection with the contact metallizations of the chip, in particular if the contact metallizations of the chip exhibit a lead/tin alloy or similar alloys with a correspondingly low melting point.

If the connection strands of the chip are connected with the terminals of the coil unit, the chip carrier can serve as the basic unit for manufacturing a transponder, wherein the basic unit need only be enhanced by contact with a chip.

Based on the chip module described above, it is also possible, as already mentioned above, to provide a transponder module in which the connection strands contacted with the contact metallizations of the chip are connected according to the invention with terminals of a coil unit.

In the chip module according to the invention, the contact metallizations of the chip are contacted with the top side of the connection strands of the chip carrier. In addition to the fact that the chip module can be manufactured with a simple flip-chip contact, this chip module structure offers the advantage of making the side of the substrate lying opposite the connection strands available for further applications.

If the connection strands contacted with the contact metallizations of the chip are additionally connected with the terminals of a coil unit, a transponder module with an especially simple structure is obtained.

The method according to the invention of manufacturing a chip module involves the following steps:

applying at least two electrically conductive connection strands to one side of the carrier film, so that the connection strands lie parallel to each other in a single plane, and extend in a planar direction over the carrier film, and contacting contact metallizations of the chip with the connection strands, so that a contact metallization of the chip is contacted with a respective connection strand.

As already emphasized at the outset while describing the structure of the chip module according to the invention, the manufacturing process is characterized by the lowest possible number of steps, due to the fact that the substrate provided with connection leads is realized via a simple combination of connection strands with a carrier film, and the type of contacting according to the invention enables a simple flip-chip contacting.

If the connection strands are contacted with the coil unit before being contacted with the chip, a first portion of the manufacturing process, which can also be executed independently of the subsequent contacting with the chip, yields an intermediate product in the form of a chip carrier, which can be directly used for manufacturing transponder units.

One particularly economic vat of the method according to the invention can be implemented if the connection strands are continuously applied to the carrier film, so that the connection strands and the carrier film are provided as continuous strands, and moved continuously toward each other in a contact area with the generation of an adhesion.

If the carrier film is provided with window openings at defined distances before forming the contact area with the connection strands, so that the window openings in the subsequently formed contact area are covered by the connection strands while forming pocket-like contact receptacles, it becomes possible to manufacture a chip module even without the influence of a continuous process, in which the contact metallizations of the chip are contacted with the bottom side of the connection strands, and the chip itself is located on the side of the carrier film opposite the connection strands.

Therefore, this method variant enables the manufacture of an especially flat or thin chip module.

A chip module with a capacitor structure can be manufactured in another method variant by placing at least one additional electrically conductive counter-strand on the side lying opposite the side intended for applying the connection strands. This process can take place before or after applying the connection strands on the carrier film.

One particularly easy and hence cost-effective way of implementing the method is made possible by applying the connection strands and/or at least one counter-strand on the carrier film in a lamination process. In this connection, it is also advantageous to use a hot-melt coating to form an adhesion between the connection strands and/or the at least one counter-strand and the carrier film.

An embodiment of the chip module and a variant of the method of manufacturing the chip module shall be explained in greater detail below based on the drawings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
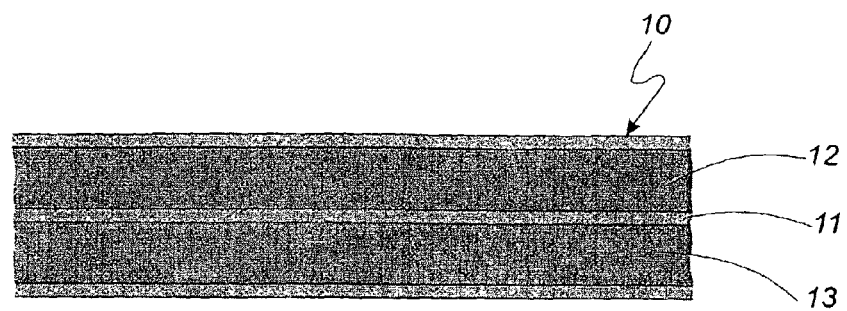
FIG. 1 is a top view of a chip carrier for manufacturing a chip module.

Referring to the drawings in particular, FIG. 1 shows a top view of a section of a chip carrier strand 10 with a carrier film 11 and connection strands 12 and 13 applied to one side of the carrier film 11.

Figure 2:
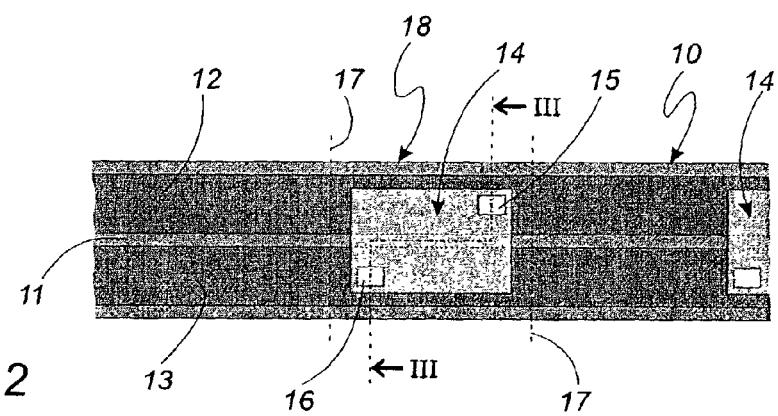
FIG. 2 is a view of the chip carrier shown in FIG. 1 with a chip in contact thereupon to form a chip module.

FIG. 2 shows the chip carrier strand 10 depicted in FIG. 1 with numerous spaced chips 14 contacted on the chip carrier strand 10. As evident from FIG. 2, the chips 14 with their contact metallizations, also referred to as "bumps" in technical parlance, are placed in contact with connection strands 12, 13 in flip-chip technology in such a way that one bump 15 or 16 is allocated to a connection strand 12, 13 in an electrically conductive manner.

As indicated by separating lines 17 in FIG. 2, chip modules 18 are detached from the composite chip module held together by the chip carrier strand 10 via separating cuts through the chip carrier strand 10 after the chips 14 have contacted the chip carrier strand 10.

Figure 3:
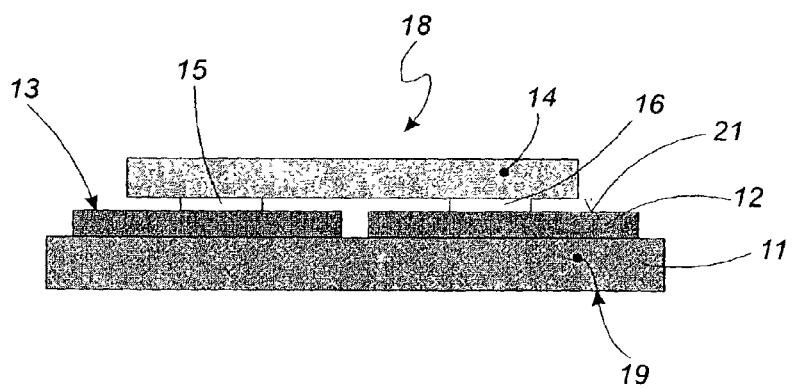
FIG. 3 is a sectional view of a first embodiment of a chip module.

FIG. 3 shows a sectional view according to intersecting line III—III in FIG. 2. As evident, chip 14 is in contact in flip-chip technology with its bumps 15, 16 on the connection strands 12, 13 of the chip carrier 19 separated out of the chip carrier strand 10 along separating lines 17. In this case, the carrier film 11 forming the substrate of the chip carrier 19 consists of kapton, whose top side is covered with the connection strands 12, 13 made out of so-called E copper. To improve the surface quality of the connection strands 12. 13, the latter are coated with a contact metallization in this case. Other electrically non-conductive materials can also be used for the chip carrier 19 or chip carrier strand 10, e.g., epoxy glass, polyester, polycarbonate and polyimide, wherein a flexible design of the carrier film 11, e.g., using polyimide, is advantageous, in particular when using a manufacturing process of the kind explained in greater detail below with reference to FIG. 7.

Figure 4:
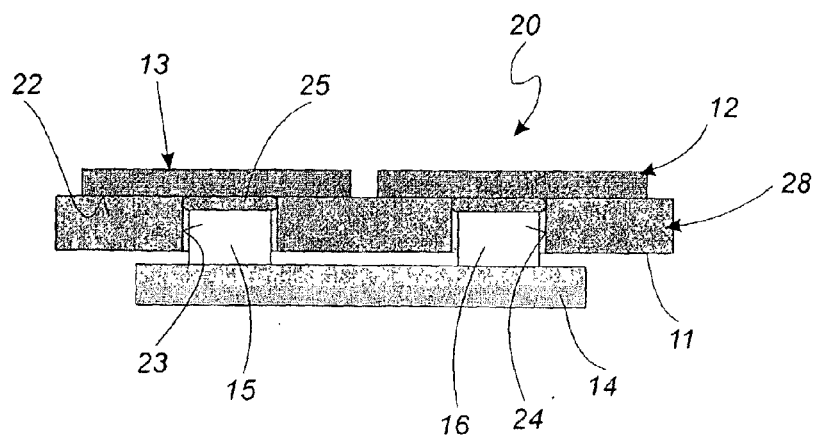
FIG. 4 is a sectional view of a second embodiment of the chip module.

FIG. 4 shows a variant of a chip module 20 in which the chip 14 is placed in contact with a bottom side 22 of the connection strands 12, 13, as opposed to the chip module 18 shown in FIG. 3, where the chip 14 is in contact with a top side 21 of the connection strands 12, 13.

To this end, pocket-like contact receptacles 23, 24 are formed in the areas of the carrier film 11 of a chip carrier 28 covered by the connection strands 12, 13, and used to accommodate the bumps 15, 16 of the chip 14. Given the appropriate preparation of the surfaces of connection strands 12, 13, e.g., via contact metallization, the bumps 15, 16 can be directly in contact with the connection strands 12, 13, or a contacting process as shown in FIG. 4 can be performed, in which a separate bonding material, e.g., soldering material 25 situated between the bottom sides 22 of the connection strands 12, 13 and the bumps 15, 16 of the chip 14 is additionally provided.

Figure 5:
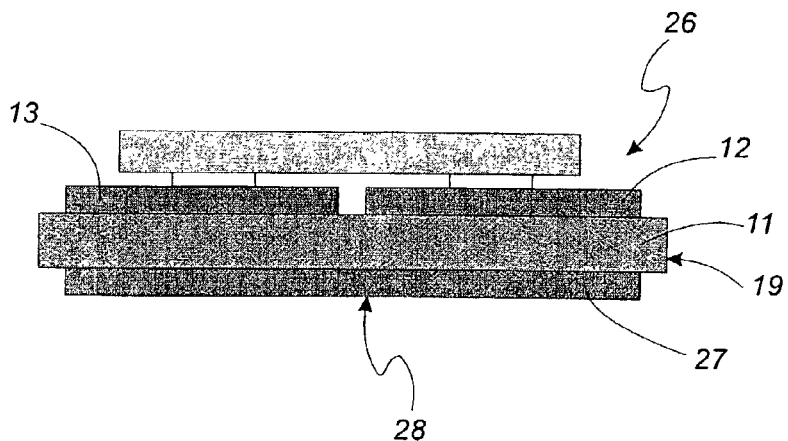
FIG. 5 is a sectional view of a third embodiment of a chip module.

FIG. 5 shows another embodiment of a chip module 26, in which, as opposed to the chip module 18 shown in FIG. 3, a counter-strand 27 is provided on the side of the carrier film 11 opposite the connection strands 12, 13, which is applied to the carrier film 11 in the same manner as the connection strands 12,13, and can consist of the same material as the connection strands 12, 13.

Figure 6:
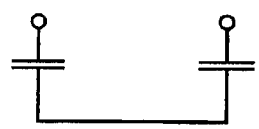
FIG. 6 is a sectional view of an electrical equivalent circuit diagram for the substrate of the chip module shown in FIG. 5.

The structure shown in FIG. 5 of opposing connection strands 12, 13 separated from each other by an insulating intermediate layer in the form of the carrier layer 11 on the one hand and the counter strand 27 on the other yields an electric capacitor arrangement whose circuit diagram is shown in FIG. 6. According to FIG. 6, the structure of the substrate 28 yields an electrical serial connection of two capacitors arranged parallel to the chip 14.

Figure 7:
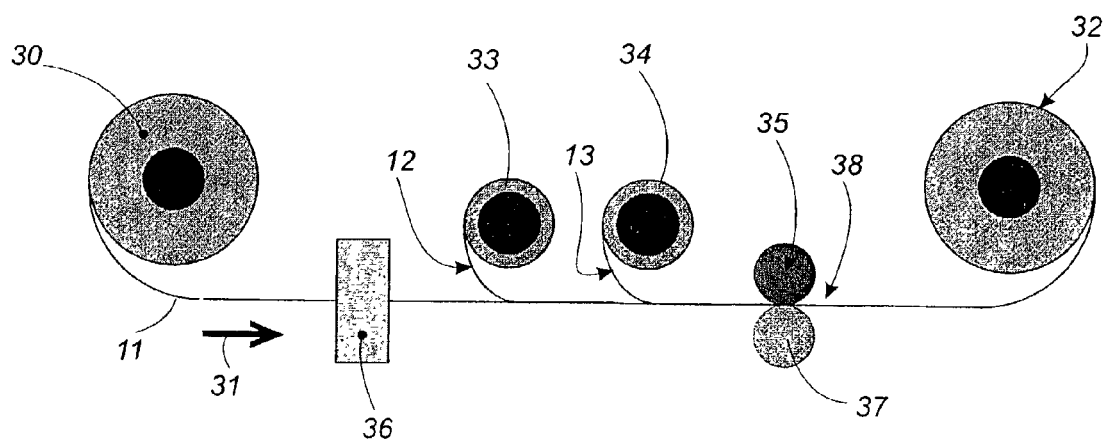
FIG. 7 is a diagrammatic view of a device for performing a variant of the method of manufacturing the chip module.

FIG. 7 shows a possible variant for manufacturing a chip module, wherein the system design shown in FIG. 7 enables in particular the manufacture of the chip module 20 shown in FIG. 4 in a continuous and interconnected arrangement. To this end, the system diagrammatically shown in FIG. 7 encompasses a supply roll 30 with carrier film 11 wound onto it, which is unrolled in the direction of arrow 31, and wound up at the end of the system on a product roll 32. Located in the area between the supply roll 30 and product roll 32 are two supply rolls 33 and 34 with wound up connection strand 12 or 13. Located between the supply rolls 33 and 34 on the one hand and the product roll 32 on the other is a laminating roller 35. To manufacture a continuous, band-shaped and interconnected arrangement of chip carriers 28 or chip modules 20, as shown in FIG. 4, the carrier film 11 is clocked and advanced in the direction of the arrow 31 according to FIG. 7, wherein window openings are incorporated into the carrier film 11 at the prescribed clock rate at defined intervals via a stamping device 36 to form the contact receptacles 23, 24 shown in FIG. 4. Downstream of the stamping device 36, the connection strands 12, 13 are supplied to the carrier film 11 from the supply rolls 33, 34, and then connected with the carrier film 11 in a roll slit formed by the laminating roll 35 and a counter-roll 37 in a contact area 38. As a result of this joining or connecting process, the chip carrier 28 shown in cross section in FIG. 4 is therefore generated in continuous form downstream of the laminating roll 35, and wound on the product roll 32. The product roll 32 can now be used as a supply roll for a subsequent manufacturing process for the continuous or clocked contacting of chips 14 with the connection strands 12, 13, thus making it possible to manufacture continuously interconnected chip modules 20 as shown in FIG. 4.

To prepare for a subsequent manufacture of transponder units, coil units can also be contacted with the connection strands after the laminating process. The coils can here be designed as desired. The coils can be arranged on a separate carrier, or have no carrier in a particularly advantageous variant, being applied directly to the carrier film and contacted with the connection strands. In this connection, the use of wire coils proves advantageous.

While specific embodiments of the invention have been shown and described in detail to illustrate the application of the principles of the invention, it will be understood that the invention may be embodied otherwise without departing from such principles.

The invention claimed is:

1. A chip module, comprising:
   a chip carrier comprising a substrate formed by a flexible carrier film and connection leads arranged exposedly on the surface of the substrate to be freely accessible, said connection leads comprising stripes and extend parallel over the substrate, said connection leads comprising electrically conductive connection strands arranged on said substrate in a single plane and extending in a planar direction over the entire substrate surface and having a longitudinal expansion flush with the substrate surface, said electrically conductive connection strands being independent and separate elements from said substrate; and
   a chip having connecting surfaces with elevated contact metallizations, said contact metallizations being in contact with a top side of said connection strands facing away from the carrier film.

2. A chip module according to claim 1, wherein the connection strands are in contact with the contact metallizations of the chip and are connected with the terminals of a coil unit.

3. A chip carrier arrangement in accordance with claim 1, wherein:
   said carrier film and said electrically conductive strands have a flexibility to be provided in rolls.

4. A chip carrier arrangement formed by the process steps comprising:
   providing a flexible carrier film having a longitudinal dimension;
   providing a plurality of electrically conductive connection strands, said electrically conductive connection strands being provided separately and independently from said carrier film;
   attaching said electrically conductive connection strands onto said carrier film as stripes extending substantially in parallel over said carrier film, said electrically conductive connection strands being arranged exposedly on the surface of said carrier film in a substantially single plane and extending in a planar direction over said entire longitudinal dimension of said carrier film;

dividing said carrier film with attached said electrically conductive strands into a plurality of substrates, said dividing being transverse to said longitudinal dimension.

5. A chip carrier arrangement in accordance with claim 4, further comprising:
providing a chip with contact metallizations;
connecting said contact metallizations with said electrically conductive strands.

6. A chip carrier arrangement in accordance with claim 4, wherein:
said carrier film and said electrically conductive strands have a flexibility to be wound into rolls.

7. A chip carrier arrangement in accordance with claim 4, wherein:
said carrier film and attached said electrically conductive strands have a flexibility to be wound into a roll.

8. A chip carrier arrangement in accordance with claim 4, wherein:
said attaching of said electrically conductive connection strands onto said carrier film is performed with adhesive.

9. A chip carrier arrangement formed by the process steps comprising:
providing a carrier film having a longitudinal dimension;
providing a plurality of electrically conductive connection strands, said electrically conductive connection strands being provided separately and independently from said carrier film;
attaching said electrically conductive connection strands onto said carrier film as stripes extending substantially in parallel over said carrier film, said electrically conductive connection strands being arranged on said carrier film in a substantially single plane and extending in a planar direction over said entire longitudinal dimension of said carrier film;
providing a plurality of chips with contact metallizations;
connecting said contact metallizations of said plurality of chips with said electrically conductive strands;
dividing said carrier film with attached said electrically conductive strands and attached said chips into a plurality of substrates, said dividing being transverse to said longitudinal dimension said dividing being performed to place one of said plurality of chips on each of said plurality of substrates, wherein:
said attaching of said electrically conductive connection strands onto said carrier film is performed with adhesive;
said carrier film and attached said electrically conductive strands have a flexibility to be wound into a roll.

* * * * *